US006232660B1

(12) United States Patent
Kakimoto et al.

(10) Patent No.: US 6,232,660 B1
(45) Date of Patent: May 15, 2001

(54) HIGH-FREQUENCY SEMICONDUCTOR DEVICE PROVIDED WITH PERIPHERAL BUMPS ON CHIP PERIPHERY THAT SURROUND HIGH-FREQUENCY SEMICONDUCTOR CHIP (75) Inventors: Noriko Kakimoto; Eiji Suematsu, both of Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/263,934

(22) Filed: Mar. 8, 1999

(30) Foreign Application Priority Data

Mar. 10, 1998 (JP) .................................................. 10-058192

(51) Int. Cl.$^7$ ................................................. H01L 23/34
(52) U.S. Cl. ........................ 257/728; 257/691; 257/778; 257/773; 257/780; 257/774
(58) Field of Search .................................. 257/728, 774, 257/773, 691, 778, 779, 780

(56) References Cited

U.S. PATENT DOCUMENTS 5,406,125  4/1995  Johnson et al. .
5,500,556 * 3/1996  Kosugi ................................. 257/718
5,708,283  1/1998  Wen et al. .

FOREIGN PATENT DOCUMENTS

| 0634890A | 1/1995 | (EP) . |
| 0718905A | 6/1996 | (EP) . |
| 4-79255  | 3/1992 | (JP) . |
| 9-82826  | 3/1997 | (JP) . |

* cited by examiner

Primary Examiner—Minh Loan Tran
Assistant Examiner—Luan Thai (57) ABSTRACT

A high-frequency semiconductor device includes an interconnection substrate having one surface where a substrate high-frequency circuit including a front ground is formed and the other surface where a back ground is formed. There are peripheral bumps including ground bumps placed on the periphery of a high-frequency semiconductor chip with an interval equal to or less than a first prescribed length to surround the high-frequency semiconductor chip where a chip high-frequency circuit is formed. Conductive through holes are placed in a region of the interconnection substrate separated from a signal line connected to a signal bump of the high-frequency semiconductor chip by the first prescribed length or less and separated from the peripheral bumps by the first prescribed length or less for connecting the front ground and the back ground.

18 Claims, 11 Drawing Sheets

HIGH-FREQUENCY SEMICONDUCTOR DEVICE PROVIDED WITH PERIPHERAL BUMPS ON CHIP PERIPHERY THAT SURROUND HIGH-FREQUENCY SEMICONDUCTOR CHIP

BACKGROUND OF THE INVENTION

1. Field of the Invention

The present invention relates to high-frequency semiconductor devices used in the range of high-frequency waves such as microwave and millimetric wave, and particularly to a high-frequency semiconductor device having a superior high-frequency characteristic.

2. Description of the Background Art

As the processing speed of information processors improves and the resolution of image processing devices is enhanced, high-speed and large-capacity personal communication in the high-frequency range such as the millimetric wave band of 30 G-300 GHz, or the centimetric wave band and submillimetric wave band of frequencies higher or lower than that is attracting attention recently. In such communication, not only making use of the high-frequency characteristic but development of a high-frequency package with small size, low cost, and short development period is required.

Generally, the high-frequency package often requires sealing in terms of three aspects, that is, electromagnetic wave, hermetic concern, and mechanical concern. In terms of the mechanical aspect, the reason for sealing is similar to that of the ordinary semiconductor package. In terms of the hermetic aspect, the reason for sealing is that variation of moisture and temperature often influences the high-frequency characteristic of the high-frequency semiconductor chip.

With regard to the sealing in terms of electromagnetic wave, in a high-frequency package for frequencies in the millimetric wave band and the band of frequencies higher and lower than that, the factor which is negligible in the high-frequency package of the mobile telephone or PHS (Personal Handy-phone System) with relatively lower frequency in the millimetric wave band is important in designing the high-frequency semiconductor device. Specifically, in the range of the millimetric wave band, the wavelength is 1–10 mm in the atmosphere, and the effective wavelength is approximately from 100 microns to several millimeters considering the dielectric constant of the material constituting the package. This length corresponds to the size of the high-frequency semiconductor chip, package or high-frequency circuit, so that the three-dimensional shape thereof as well as the material characteristics such as the dielectric constant and the dielectric loss have a significant influence on the high-frequency characteristic of the high-frequency package. In view of this, the design of the three-dimensional shape in the package becomes an important factor.

Figure 1:
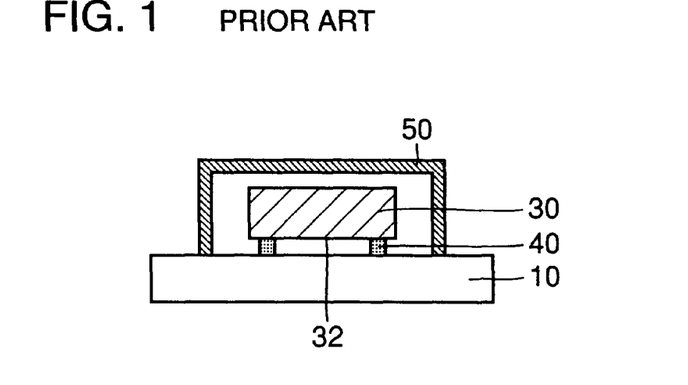
FIG. 1 illustrates a cross section of a high-frequency package of the first conventional art.

FIG. 1 shows a cross section of a conventional high-frequency package as the first example. The high-frequency package includes an interconnection substrate 10, a high-frequency semiconductor chip 30 where a high-frequency circuit 32 is formed, a plurality of bumps 40, and a cap 50. On interconnection substrate 10, high-frequency semiconductor chip 30 is connected by chip-bonding. Bumps 40 of high-frequency semiconductor chip 30 include signal bumps for input, output, power supply, bias and the like as well as several ground bumps. These bumps are used only for connection of high-frequency semiconductor chip 30. Cap 50 is formed of metal, for example, in order to provide not only hermetic and mechanical sealing but sealing in terms of electromagnetic wave.

Figure 2:
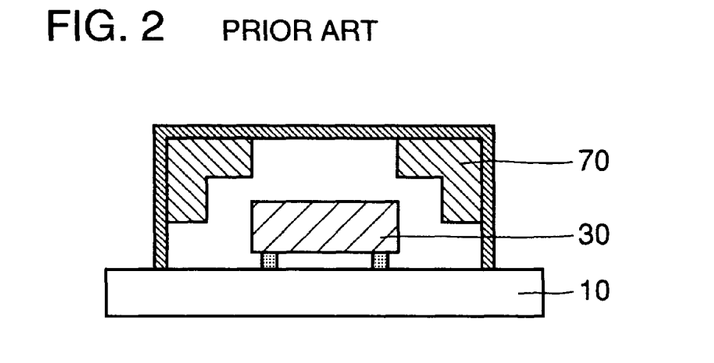
FIG. 2 illustrates a cross section of a high-frequency package of the second conventional art.

FIG. 2 shows a cross section of a conventional high-frequency package as the second example. The high-frequency package is the invention disclosed in Japanese Patent Laying-Open No. 4-79255. The difference between the invention and the conventional art shown in FIG. 1 is that an electromagnetic wave absorption block 70 is provided within a cap 50 for absorbing electromagnetic waves emitted from a gap between a high-frequency semiconductor chip 30 and an interconnection substrate 10 to prevent unnecessary interference and reflection.

Figure 3:
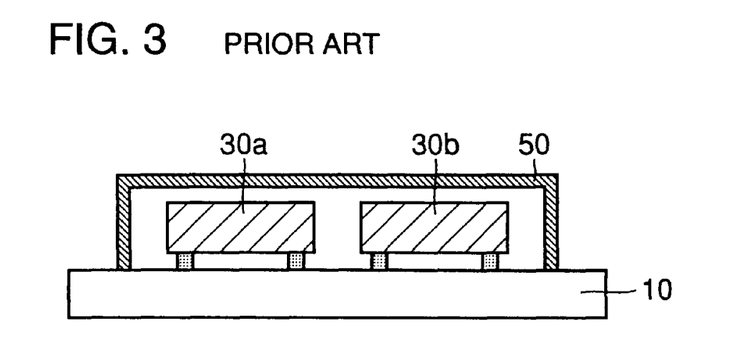
FIG. 3 illustrates a cross section of a high-frequency package of the third conventional art.

FIG. 3 shows a cross section of a conventional high-frequency package as the third example. The difference between this package and the conventional art shown in FIG. 1 is that a plurality of high-frequency semiconductor chips 30a and 30b are provided inside a package formed of an interconnection substrate 10 and a cap 50 in order to provide the high-frequency semiconductor with multifunction or an improved high-frequency characteristic.

Figure 4A:
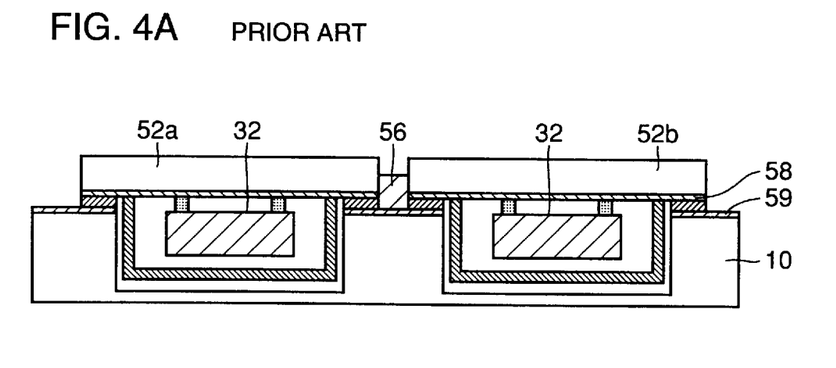
FIGS. 4A and 4B illustrate cross sections of a high-frequency package of the fourth conventional art.
Figure 4B:
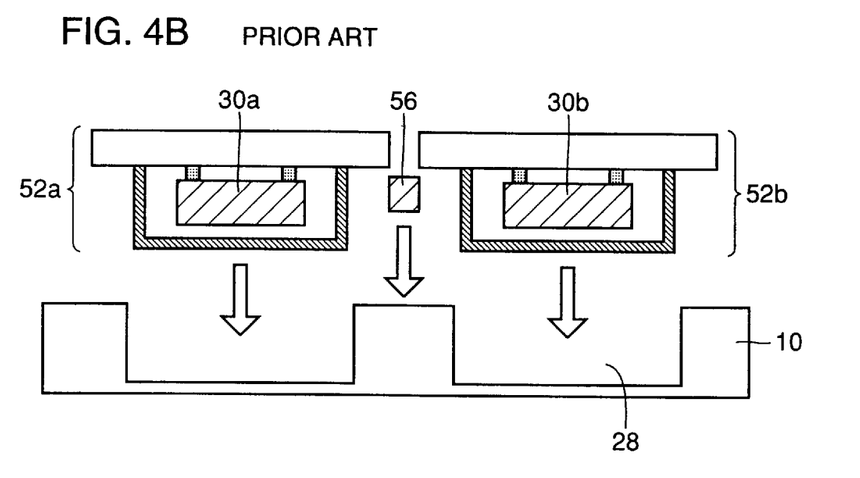

FIGS. 4A and 4B respectively illustrate a cross section of a conventional high-frequency package as the fourth example and a manufacturing procedure thereof. The high-frequency package includes an interconnection substrate 10, separate packages 52a and 52b, and a guard cap 56. As shown in FIG. 4B, high-frequency semiconductor chips 30a and 30b are respectively housed in separate packages 52a and 52b, and separate packages 52a and 52b are reversed to be placed in package insert holes 28 of interconnection substrate 10. In the high-frequency package accordingly produced, a high-frequency signal line 58 at separate package 52b and a high-frequency signal line 59 at interconnection substrate 10 are connected, and the exposed portion of high-frequency signal line 59 at interconnection substrate 10 is covered with guard cap 56 as shown in FIG. 4A.

Regarding the conventional art illustrated in FIG. 1, bumps 40 connected to the periphery of high-frequency semiconductor chip 30 are used for electrical connection of high-frequency semiconductor chip 30 only. Therefore, electromagnetic waves emitted from chip high-frequency circuit 32 inside high-frequency semiconductor chip 30 leak from the gap between high-frequency semiconductor chip 30 and interconnection substrate 10. This leakage causes reflection and interference of the electromagnetic waves on the inner surface of cap 50 formed of metal, increase of noise level, generation of ripple and the like, leading to difficulty in implementation of a high performance high-frequency package having a superior characteristic such as low noise and wideband.

Regarding the second conventional art illustrated in FIG. 2, electromagnetic wave absorption block 70 having an appropriate shape is arranged at any suitable location in order to prevent deterioration of the high-frequency characteristic caused by the electromagnetic waves leaking from the gap between high-frequency semiconductor chip 30 and interconnection substrate 10. However, design of the shape and arrangement of electromagnetic wave absorption block 70 is difficult, and a series of processes of simulation, trial manufacture, and measurement evaluation should be repeatedly carried out for optimization. Consequently, the development period increases and the design cost becomes enormous. Further, a high-frequency package housing a high-frequency semiconductor chip having various functions, various sizes, and various ways of emission of the electromagnetic waves in order to meet the needs for various types of products is required, and corresponding design should be made individually. Generally, it is desirable to proceed development and design of a high-frequency package while a high-frequency semiconductor chip is developed and designed. However, manufacturing of the high-frequency package as a trial for measurement evaluation of electromagnetic wave emission is impossible unless the high-frequency semiconductor chip is available. In addition, if the number of chips obtained from a wafer is increased to reduce the cost and accordingly the size of the chip itself is reduced, or if one chip and one package are realized by assembling different chips and different packages, the chip size and the interconnection substrate should be changed. A problem in this case is that the three dimensional shape of the package should be designed again.

Regarding the third conventional art illustrated in FIG. 3, electromagnetic waves leak from the gap between high-frequency semiconductor chip 30a or 30b and interconnection substrate 10, and the electromagnetic wave from high-frequency semiconductor chip 30a and the electromagnetic wave from high-frequency semiconductor chip 30b influence each other even if the entire interconnection substrate 10 is covered with cap 50, and thus a superior high-frequency characteristic is not achieved. For this reason, the electromagnetic wave absorption block or the like may be provided. However, the increase in the number of high-frequency semiconductor chips leads to enormous difficulty in design of the electromagnetic wave absorption block. Further, the problem above cannot be solved by the electromagnetic wave absorption block only.

In the fourth conventional art shown in FIGS. 4A and 4B, separate package 52a accommodating high-frequency semiconductor chip 30a and separate package 52b accommodating high-frequency semiconductor chip 30b are formed as separate units so that design of the high-frequency package is easy. However, a connecting point is necessary between high-frequency signal line 58 of separate package 52 and high-frequency signal line 59 of interconnection substrate 10. Consequently, compared with the high-frequency semiconductor chip which is flip-chip bonded directly to the interconnection substrate, two connecting points are added per one chip between chip high-frequency circuits 32 and substrate high-frequency circuits (not shown). Generally, unnecessary reflection is likely to occur at the connecting points, and the increase of the unnecessary reflection leads to reduction in the high-frequency characteristic. In manufacturing of the separate high-frequency packages, two connections of the flip-chip bonding and the separate cap sealing are required. Additionally, one connection for mounting the individual high-frequency package onto the interconnection substrate is required. Accordingly, total three connections per one chip are required, resulting in reduction in the high-frequency characteristic. As the number of mounted high-frequency semiconductor chips increases, the number of manufacturing processes also increases, and the productivity is accordingly decreased. Further, the increase in the number of mounted high-frequency semiconductor chips leads to a relatively large size of the interconnection substrate. In terms of the high-frequency, it is desirable that high-frequency signal line 58 of separate packages 52a and 52b and high-frequency signal line 59 of interconnection substrate 10 are located on the same plane. Therefore, package insert hole 28 of interconnection substrate 10 becomes necessary and thus the number of manufacturing processes further increases.

In the conventional art illustrated in FIGS. 4A and 4B, guard cap 56 is provided at the portion of high-frequency signal line 59 on interconnection substrate 10 that is not covered with the separate packages. Since there is approximately one portion per one chip of the high-frequency signal line that is not covered with the separate packages, corresponding number of guard caps 56 should be provided.

SUMMARY OF THE INVENTION

One object of the present invention is to provide a high-frequency semiconductor device having a structure for sealing in terms of electromagnetic wave to exhibit a superior high-frequency characteristic with a small size.

Another object of the present invention is to provide a high-frequency semiconductor device having a structure for sealing in terms of electromagnetic wave to reduce the development period and cost.

According to one aspect of the invention, a high-frequency semiconductor device includes an interconnection substrate having one surface where a substrate high-frequency circuit including a first ground is formed and the other surface where a second ground is formed, peripheral bumps including ground bumps placed on the periphery of a high-frequency semiconductor chip with a spacing equal to or less than a first prescribed length to surround the high-frequency semiconductor chip where a chip high-frequency circuit is formed, and conductive through holes placed in a region separated by the first prescribed length or less from a signal line connected to a signal bump of the high-frequency semiconductor chip and separated by the first prescribed length or less from the peripheral bumps for connecting the first ground and the second ground.

The peripheral bumps are placed on the periphery of the chip to surround the high-frequency semiconductor chip, so that electromagnetic waves generated as the waveguide mode are cut off to prevent leakage of electromagnetic waves.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS (First Embodiment)

Figure 5:
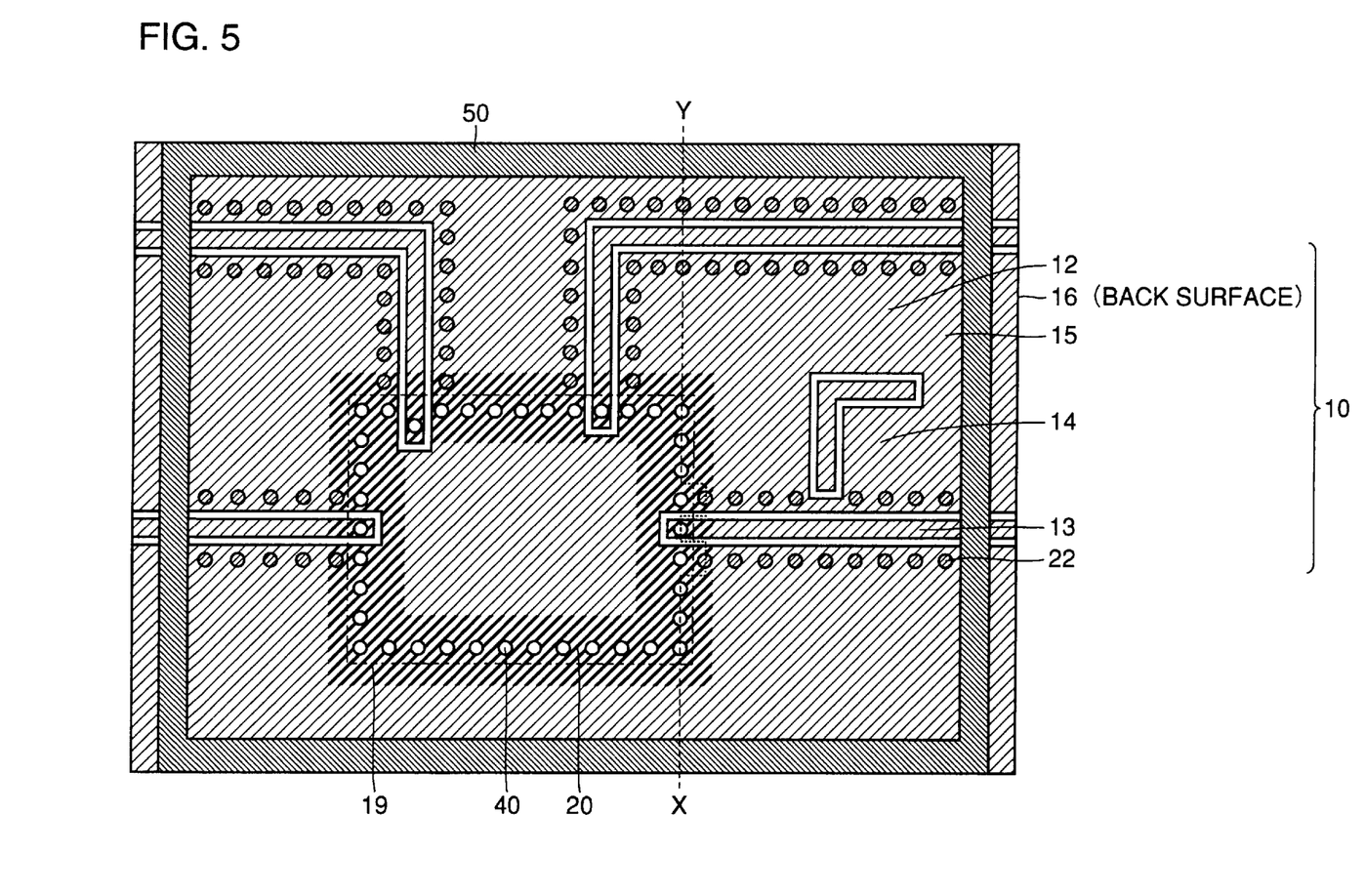
FIG. 5 is a plan view illustrating a high-frequency semiconductor device according to the first embodiment of the invention.

Referring to FIG. 5, according to the first embodiment of the invention, a high-frequency semiconductor device includes an interconnection substrate 10, a high-frequency semiconductor chip (not shown), and a conductive cap 50. On the front of interconnection substrate 10, a substrate high-frequency circuit 12 and an outer periphery ground 15 are formed. Substrate high-frequency circuit 12 is formed of a signal interconnection line 13 for input, output, power supply, bias and the like and a front ground 14. Conductive through holes 22 are formed around signal interconnection line 13 to penetrate a substrate base.

The dotted line 19 indicates a chip mount area where a high-frequency semiconductor chip 30 is mounted, and a coplanar line including a perimeter region 20 is formed. The high-frequency semiconductor chip is mounted in the chip mount area by flip-chip bonding with bumps 40.

Figure 6:
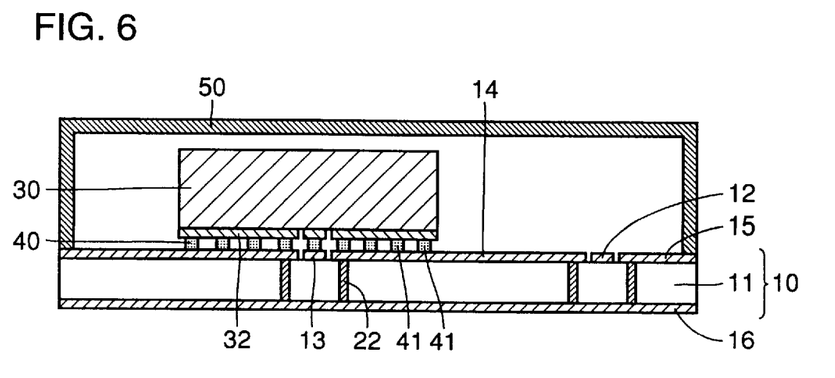
FIG. 6 illustrates a cross section of the high-frequency semiconductor device shown in FIG. 5 along X-Y.

FIG. 6 illustrates a cross section of the high-frequency semiconductor device along X-Y shown in FIG. 5 according to this embodiment. High-frequency semiconductor chip 30 is shown to be placed in chip mount area 19 shown in FIG. 5, and conductive through holes 22 are shown to penetrate substrate base 11 to be connected to outer periphery ground 15 and a back ground 16.

Figure 7A:
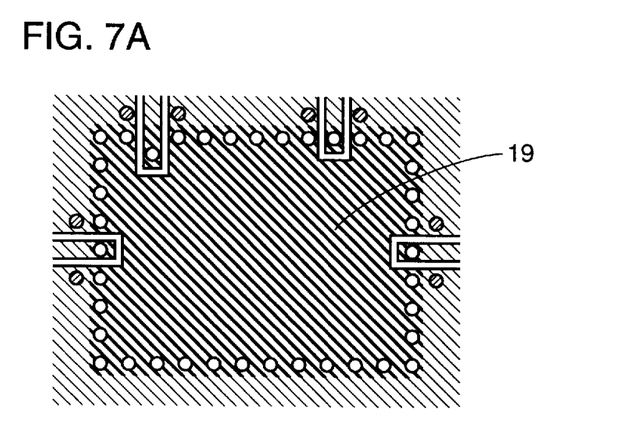
FIGS. 7A–7C illustrate details of an area where a chip of the high-frequency semiconductor device is mounted according to the first embodiment of the invention.
Figure 7B:
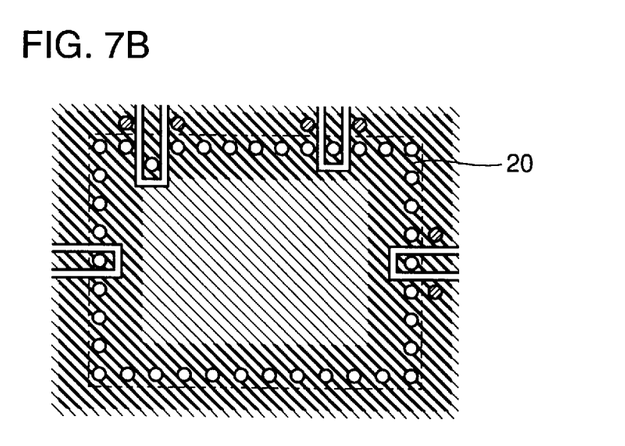
Figure 7C:
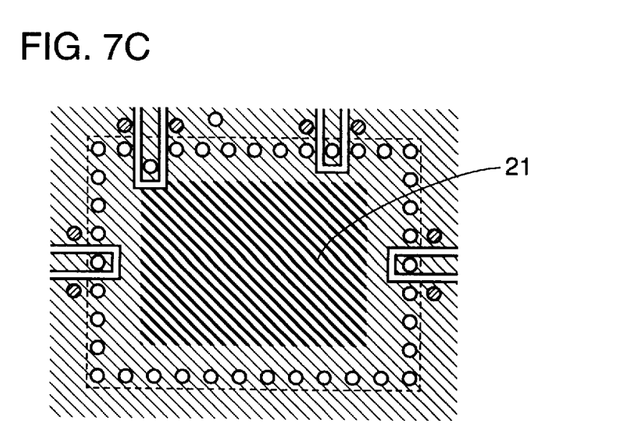

FIGS. 7A–7C are plan views illustrating details of chip mount area 19 shown in FIG. 5. FIG. 7A shows the region of chip mount area 19. In FIG. 7B, perimeter region 20 is formed of the coplanar line. A central portion 21 of chip mount area 19 shown in FIG. 7C is desirably formed as a ground or a coplanar type line in order to prevent unnecessary coupling of chip high-frequency circuit 32 and substrate high-frequency circuit 12. The unnecessary coupling is likely to occur when the height of the bump is decreased in order to reduce the inductance of bump 40. The coplanar type is especially desirable since a high-frequency signal is transferred through a signal line for output. However, the design is not limited thereto and a slot pattern for connection with chip high-frequency circuit 32 in terms of electromagnetic wave may be formed or no pattern may be formed depending on the intention of the design.

Figure 8:
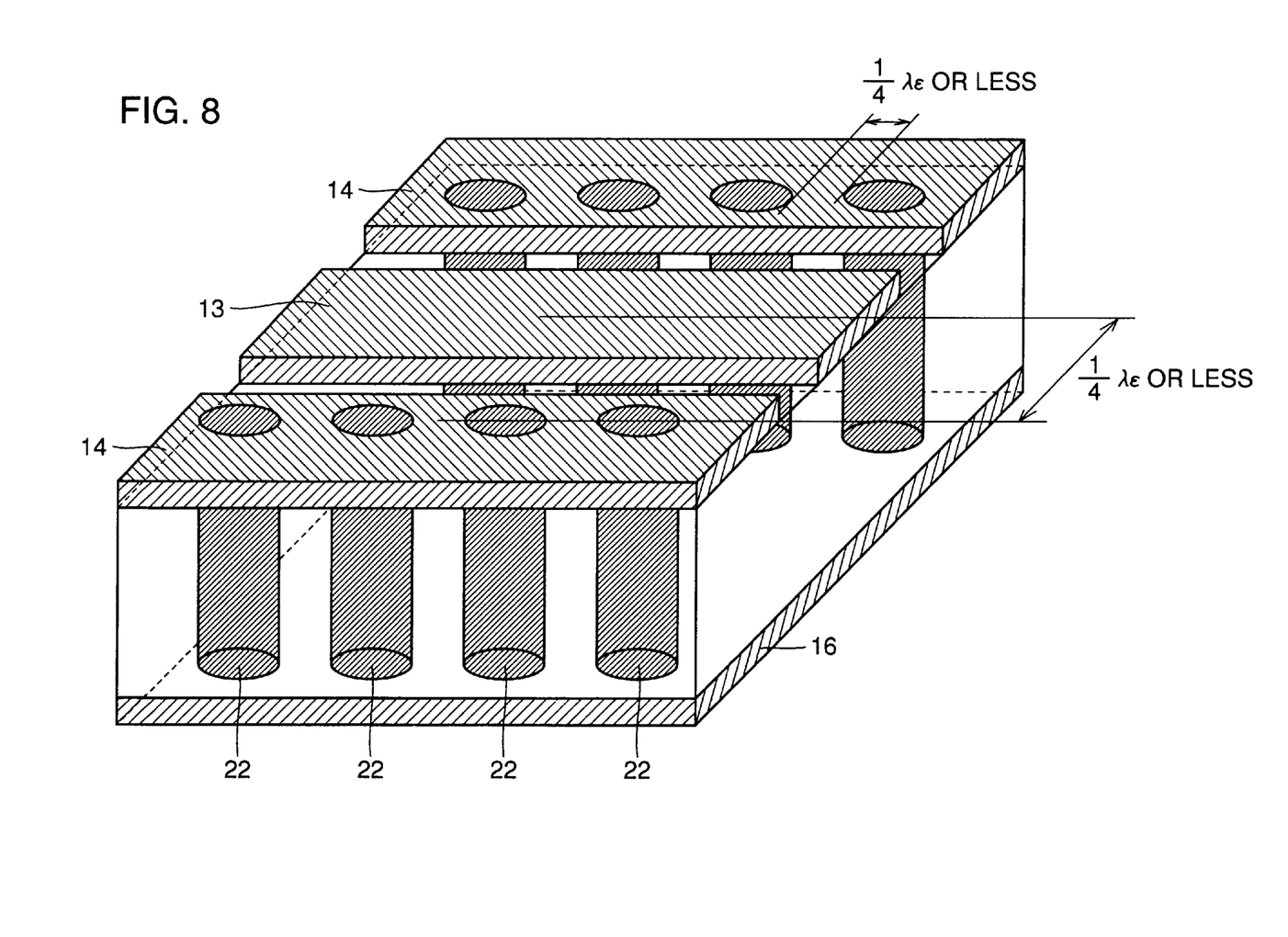
FIG. 8 is an enlarged perspective view of a signal line of the high-frequency semiconductor device according to the first embodiment of the invention.

FIG. 8 is an enlarged perspective view of signal line 13 and front ground 14. As shown in FIG. 8, the group of conductive through holes 22 connecting front ground 14 and back ground 16 are each separated from a center line of signal line 13 by one fourth of the effective wavelength or less. Further, the group of conductive through holes 22 are separated from each other by one fourth of the effective wavelength or less. Such an arrangement of the group of conductive through holes 22 provides an equal high-frequency potential of front ground 14 and back ground 16 to cause short-circuit termination of front ground 14 with back ground 16 in terms of high-frequency. This is especially effective when an output level of a high-frequency signal is high.

To shut out electromagnetic waves from chip high-frequency circuit 32 is also necessary. In the high-frequency semiconductor device according to this embodiment, the chip high-frequency circuit is sealed in terms of electromagnetic wave by placing bumps 40 inside chip mount area 19 as shown in FIG. 5, instead of sealing in terms of electromagnetic wave by covering the chip high-frequency circuit with the cap as done by the conventional way. Specifically, perimeter region 20 of chip mount area 19 of substrate high-frequency circuit 12 is formed as the coplanar type line. Additionally, peripheral bumps 41 are placed at a chip periphery 37 of chip high-frequency circuit 32 as described below, and conductive through holes 22 connecting front ground 14 and back ground 16 are formed in a prescribed area of front ground 14 sandwiching signal line 13 connected to the signal bump as shown in FIG. 5.

Figure 9:
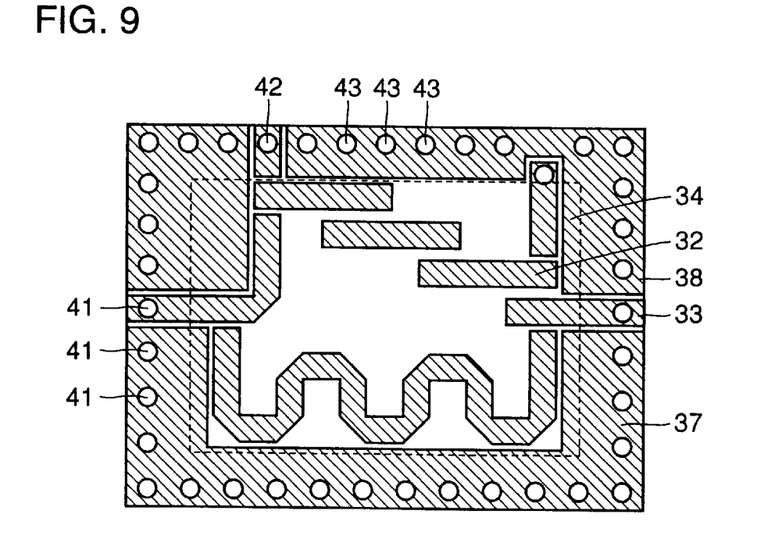
FIG. 9 is a plan view of a high-frequency semiconductor chip of the high-frequency semiconductor device according to the first embodiment of the invention.

FIG. 9 is a plan view of high-frequency semiconductor chip 30. Chip high-frequency circuit 32 is formed with its center located inside high-frequency semiconductor chip 30, and a chip periphery ground 38 is formed at chip periphery 37 with an interposed signal electrode 33 as a semiconductor pattern. Peripheral bumps 41 are arranged at chip periphery 37 to surround the inner portion of the chip. Peripheral bumps 41 are roughly classified into peripheral ground bumps 43 and peripheral signal bumps 42. Peripheral signal bumps 42 are not adjacent to each other, and the interval between peripheral ground bumps 43 is one fourth of the effective wavelength or less in principle.

The effective wavelength is determined depending on the frequency used, the semiconductor base of high-frequency semiconductor chip 30, various layers formed on the semiconductor base, dielectric constant of substrate base 11 of interconnection substrate 10 or the like, dielectric constant of the gap space or the like formed by the bumps between high-frequency semiconductor chip 30 and interconnection substrate 10, or the three dimensional shape including various conductors or the like, and is generally about a few millimeters to one hundred microns as the millimetric wave.

If the interval between peripheral bumps 41 is equal to or less than one fourth of the effective wavelength (approximately 1 millimeter to approximately several tens microns) as the millimetric wave, electromagnetic waves cannot proceed over peripheral bumps 41. The reason is that the portion surrounded by peripheral ground bumps 43 adjacent to each other, front ground 14, and back ground 16 connected to peripheral ground bumps 43 can be regarded as a waveguide, so that electromagnetic waves generated as the waveguide mode are cut off and leakage of the electromagnetic waves can be prevented. It is known theoretically that twice a gap corresponds to the cutoff frequency, specifically an interval of one half of the effective wavelength or less generates a sharp increase in attenuation. However, this is applied to a theoretical waveguide. In the case of such a supposed waveguide, since there is unevenness macroscopically and microscopically and the length of the guide is short, one fourth of the effective wavelength or less is appropriate for sufficiently stable cut-off.

Figure 10:
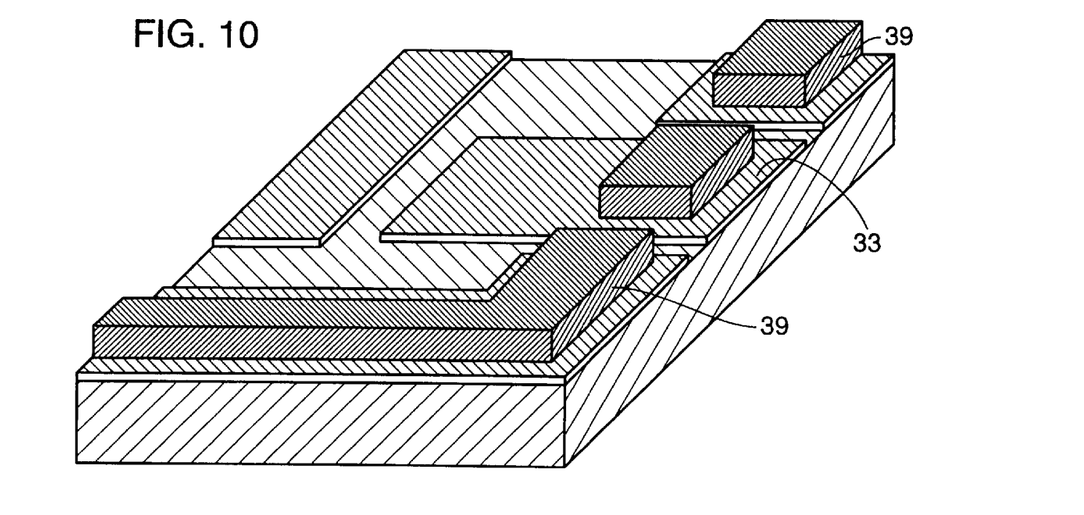
FIG. 10 is a perspective view illustrating an alternative method of arranging bumps of the high-frequency semiconductor device according to the first embodiment of the invention.

To surround high-frequency semiconductor chip 30 entirely with conductive cap 50 becomes unnecessary by arranging peripheral bumps 41 at the high-frequency semiconductor chip. Accordingly, electromagnetic waves emitted from chip high-frequency circuit 32 can be enclosed in the gap space to seal in terms of electromagnetic wave. According to this method, the number of bumps including the ground bumps increases compared with the conventional way. However, this method is desirable considering enhancement in mechanical strength for joint with interconnection substrate 10, and ground enforcement of high-frequency circuit 12 of interconnection substrate 10 as well as high-frequency circuit 32 of high-frequency semiconductor chip 30. As shown in FIG. 10, wallshaped ground bumps 39 may be arranged discontinuously at chip periphery 37 except for the portion of signal electrode 33 to surround the region inside the chip.

Figure 11:
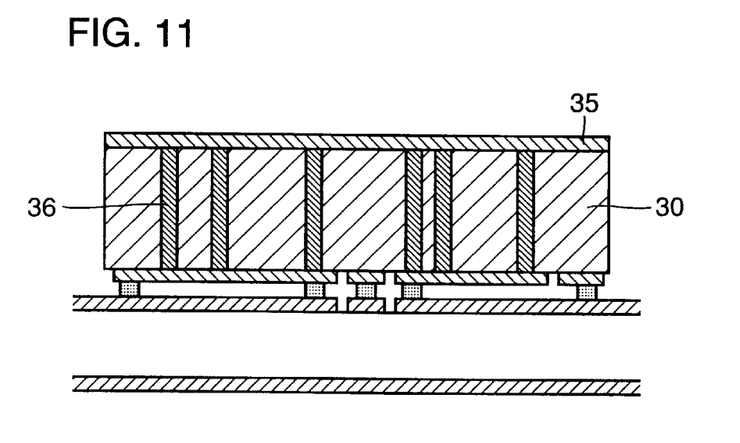
FIG. 11 is a cross sectional view illustrating an alternative high-frequency semiconductor chip of the high-frequency semiconductor device according to the first embodiment of the invention.
Figure 12A:
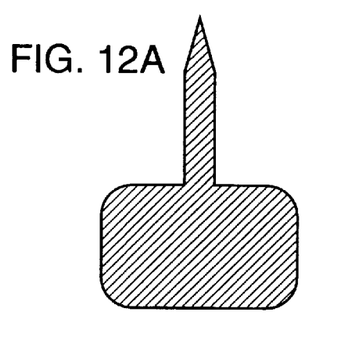
FIGS. 12A–12D illustrate shapes of bumps of the high-frequency semiconductor device according to the first embodiment of the invention.
Figure 12B:
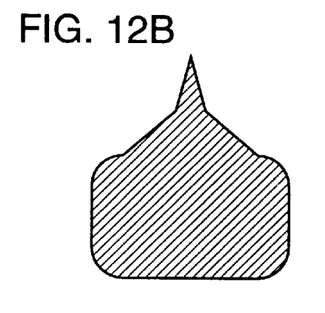
Figure 12C:
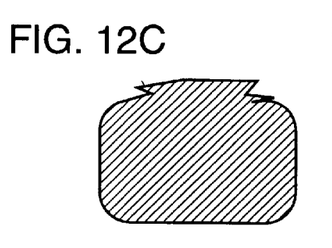
Figure 12D:
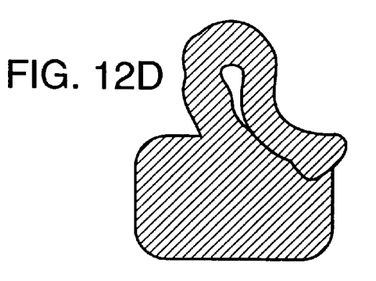

As shown in FIG. 11, a rear ground 35 may be formed on the rear side of high-frequency semiconductor chip 30 and through holes 36 may be placed between a front ground 34 of chip high-frequency circuit 32 and rear ground 35 for enforcing sealing in terms of electromagnetic wave from the rear side of high-frequency semiconductor chip 30. Since radiation of electromagnetic waves to a space is stronger when the dielectric constant is lower, the structure illustrated in FIG. 11 is desirable to the low dielectric constant of the semiconductor base and to high output.

FIGS. 12A–12D are side views illustrating general shapes of the bumps produced by wire bumping before flip-chip bonding. Generally, the bump has a diameter of approximately 50–150 microns and a height of approximately 20–60 microns after flip-chip. Since the bumps can be formed after the wafer process or the dicing, the bumps can be arranged freely. This is very convenient since a desired gap can be produced by changing the wire diameter, bumping condition, and flip-chip bonding condition. This arrangement is easily applicable to all high-frequency semiconductor chips having various shapes.

If the bump is produced by electrolytic plating or the like, the mask as well as plating condition should be changed in order to change the arrangement of bumps. Further, in order to change the height of bumps, the resist thickness should be changed. The limit of the height of the bump is approximately 20 microns since this value allows openings of the resist by exposure to be made stably. Those process steps should be done in the wafer process and accordingly, the period for consideration and the cost would significantly increase compared with the bumping described above.

Figure 13:
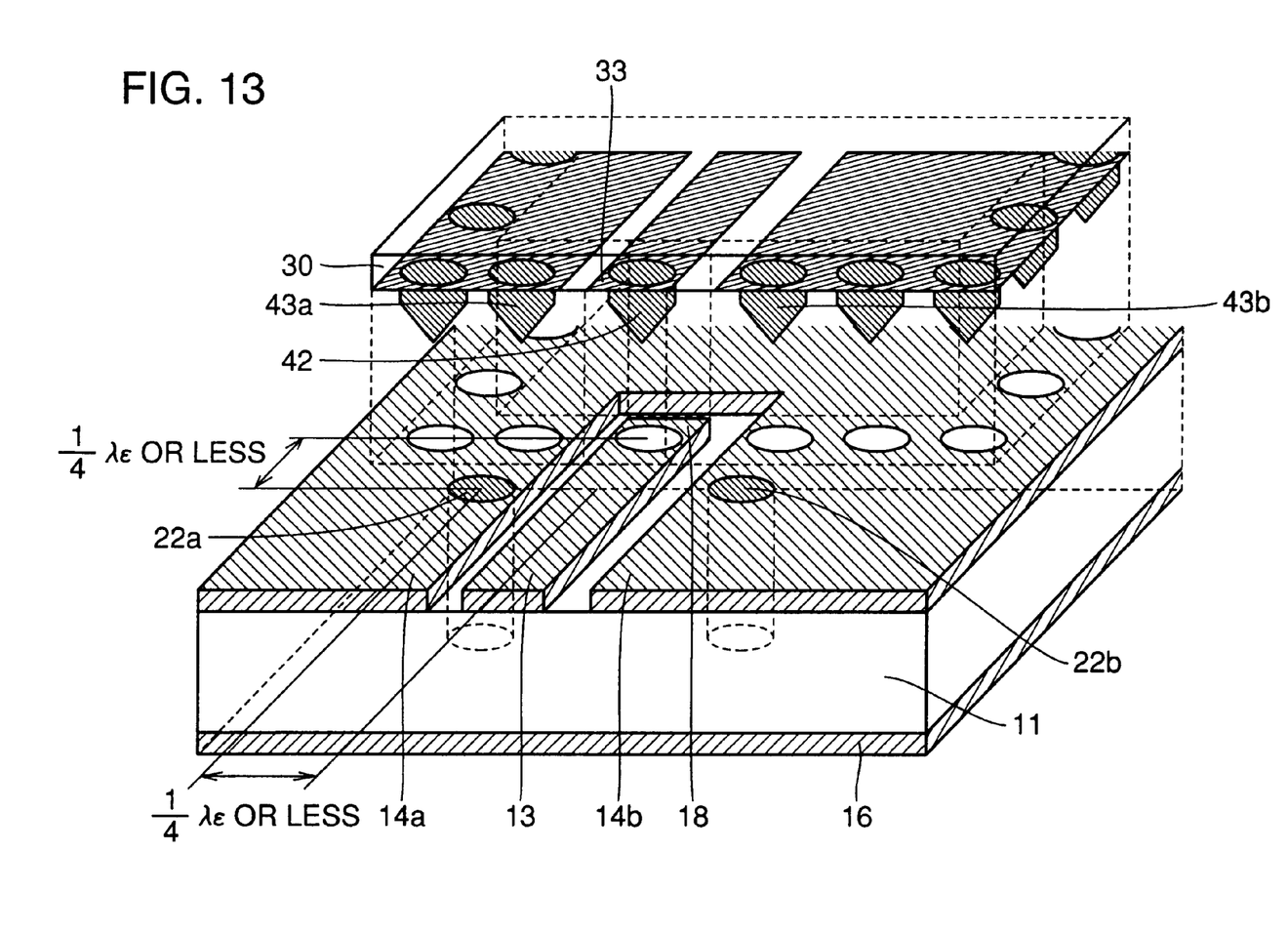
FIG. 13 is an enlarged perspective view of a portion where a peripheral signal bump and the signal line of the high-frequency semiconductor chip of the high-frequency semiconductor device are connected according to the first embodiment of the invention.

FIG. 13 is an enlarged perspective view illustrating a peripheral signal bump 42 of high-frequency semiconductor chip 30 and high-frequency signal line 13 on the interconnection substrate. Front grounds 14a and 14b formed at the same plane as signal line 13 are placed on both sides of signal line 13, and conductive through holes 22a and 22b connecting front grounds 14a and 14b and back ground 16 are placed with signal line 13 interposed therebetween at the positions (indicated by the hatched circles in the drawing) close to high-frequency semiconductor chip 30. Peripheral signal bump 42 formed at signal electrode 33 of high-frequency semiconductor chip 30 is placed between peripheral ground bumps 43a and 43b. Peripheral signal bump 42, and peripheral ground bumps 43a and 43b are respectively connected to an inner terminal 18 of signal line 13, front ground 14a and front ground 14b of the interconnection substrate.

Conductive through holes 22a and 22b are separated respectively from peripheral ground bumps 43a and 43b by one fourth of the effective wavelength or less. Conductive through holes 22a and 22b are located in an area separated from the center line of signal line 13 by one fourth of the effective wavelength or less. Since conductive through holes 22a and 22b are arranged at the position corresponding to input/output of the signal line, front grounds 14a and 14b around this portion have the same high-frequency potential, so that the front ground and the back ground are short-circuit terminated and thus a superior transmission line can be provided.

The length of conductive through hole 22 corresponds to the distance between front ground 14 and back ground 16, that is, the thickness of substrate base 11, if the high-frequency semiconductor device shown in FIG. 13 is applied. If the thickness of substrate base 11 is too large, the inductance of the conductive through hole increases and the difference in high-frequency potential between front ground 14 and back ground 16 also increases. Further, the width of signal line 13 as well as spaces respectively located between signal line 13 and front ground 14a and front ground 14b increase to increase the distance between peripheral bumps 43a and 43b, so that one fourth of the effective wavelength or less is impossible. On the other hand, the too small thickness of substrate base 11 is inappropriate since the interconnection width of substrate high-frequency circuit 12 decreases to increase transmission loss, and various differences in manufacture cannot be ignored in terms of high-frequency characteristic. In terms of mechanical aspect, the two small thickness of the substrate base is not preferable. Therefore, the range of the thickness of semiconductor base 11 is determined to some extent in order to realize a high-frequency semiconductor device having a preferable high-frequency characteristic. Considering the condition described above, the high-frequency semiconductor device of this embodiment is formed by selecting 150 microns as the optimum value. If the device is used with the microwave or the millimetric wave, an appropriate value of the thickness of substrate base 11 is often found in a range from 100 to 1000 microns.

Figure 14:
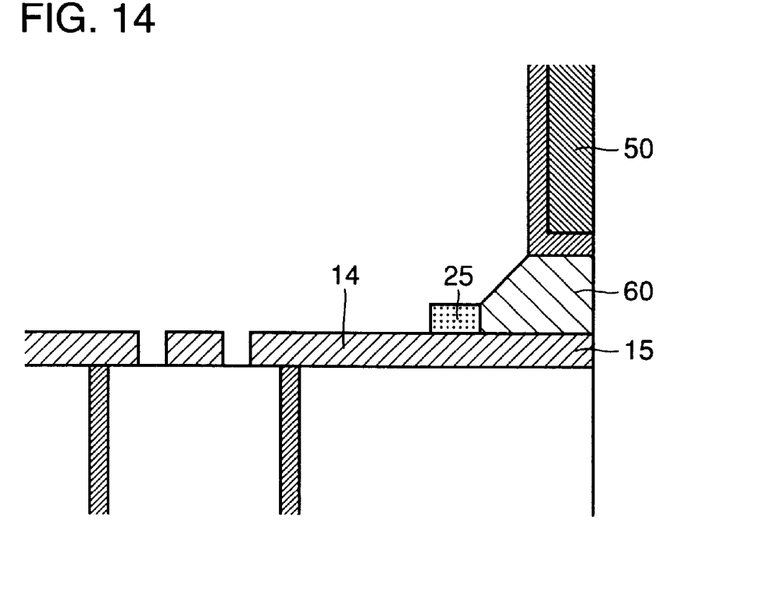
FIG. 14 is an enlarged cross sectional view of a joint connecting an outer periphery ground and a cap of the high-frequency semiconductor device according to the first embodiment of the invention.
Figure 15:
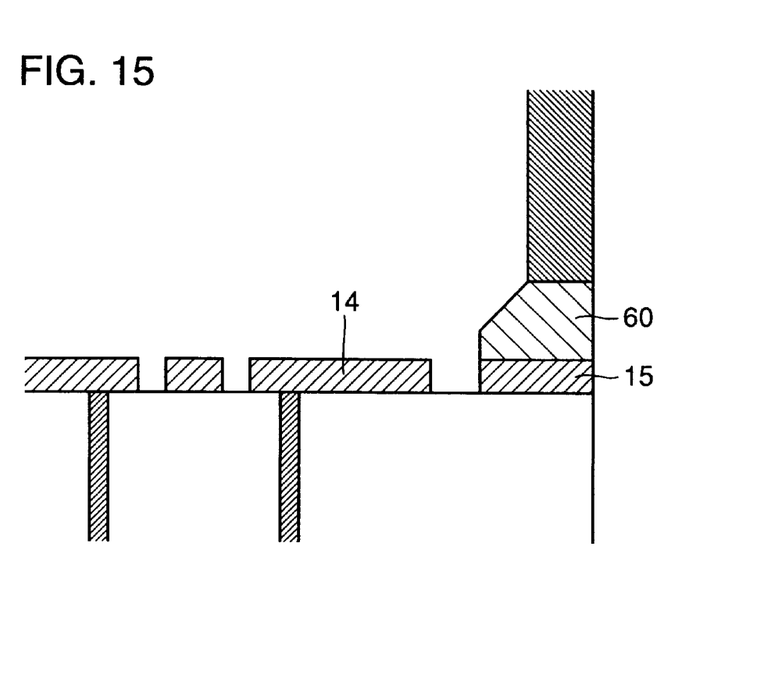
FIG. 15 is a cross sectional view illustrating an alternative method of jointing the outer periphery ground and the cap.

FIG. 14 is an enlarged cross sectional view illustrating a joint between outer periphery ground 15 and cap 50 of the high-frequency semiconductor device according to this embodiment. The reflow of high-frequency temperature solder as a conductive jointing material 60 is applied to the joint between outer periphery ground 15 and cap 50. In order to prevent the solder from flowing inside and outside, a conductor pattern is prepared such that front ground 14 and outer periphery ground 15 of substrate high-frequency circuit 12 are connected, and a solder dam 25 is provided thereon as solder antirunning agent. As shown in FIG. 15, a conductor pattern may be produced to separate front ground 14 from outer periphery ground 15. If thermo compression bonding of Au and Au is applied to conductive joint 60, solder dam 25 shown in FIG. 14 is not required, and separation of front ground 14 from outer periphery ground 15 as shown in FIG. 15 is unnecessary. The connection may be made by welding.

Figure 16:
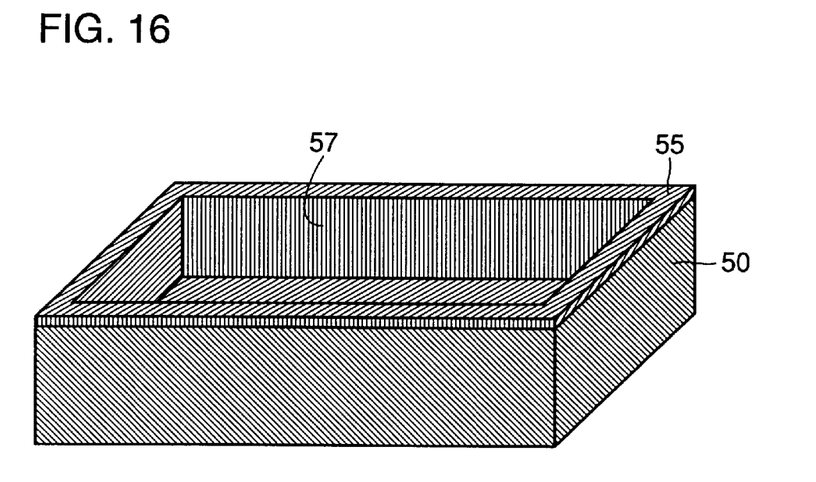
FIG. 16 is a perspective view illustrating the cap of the high-frequency semiconductor device according to the first embodiment of the invention.

FIG. 16 is an enlarged perspective view of cap 50. Cap 50 is formed mainly of a ceramic cap base, and has a function of absorbing electromagnetic waves since a cap edge 55 which is in contact with outer periphery ground 15 and an inner surface 57 of cap 50 are produced by applying a conductive material containing magnetic powder thereto and calcining it. However, emission of electromagnetic waves from high-frequency semiconductor chip 30 is shut out in this embodiment as described above. Therefore, it is enough for cap 50 to have a mechanical sealing function and hermetic sealing function. In view of this, cap 50 may be provided as a cap formed only of ceramic which has no conductivity.

The high-frequency semiconductor device according to this embodiment requires hermetic sealing since high-frequency semiconductor chip 30 is formed of material which is easily affected by moisture or temperature. Accordingly, a conductor is formed at cap edge 55 and the airtight arrangement using the high-temperature solder is applied. Depending on the component material and use, glass seal may be employed if hermetic sealing is not highly required. In this case, the conductor of the cap edge becomes unnecessary. Similarly, if the hermetic sealing is not so highly required, resin cap or resin potting may be employed. If the resin potting is used instead of the cap, the portion on the substrate high-frequency circuit as well as the gap of the high-frequency semiconductor chip are filled with resin. In this case, the ambient of the substrate high-frequency circuit and the high-frequency semiconductor chip is not atmosphere different from the case in which the cap is employed, so that a high-frequency design considering the high-frequency characteristic of the resin is required. Considering relative dielectric constant and dielectric loss for the high-frequency wave such as the millimetric wave, the use is limited.

Figure 17:
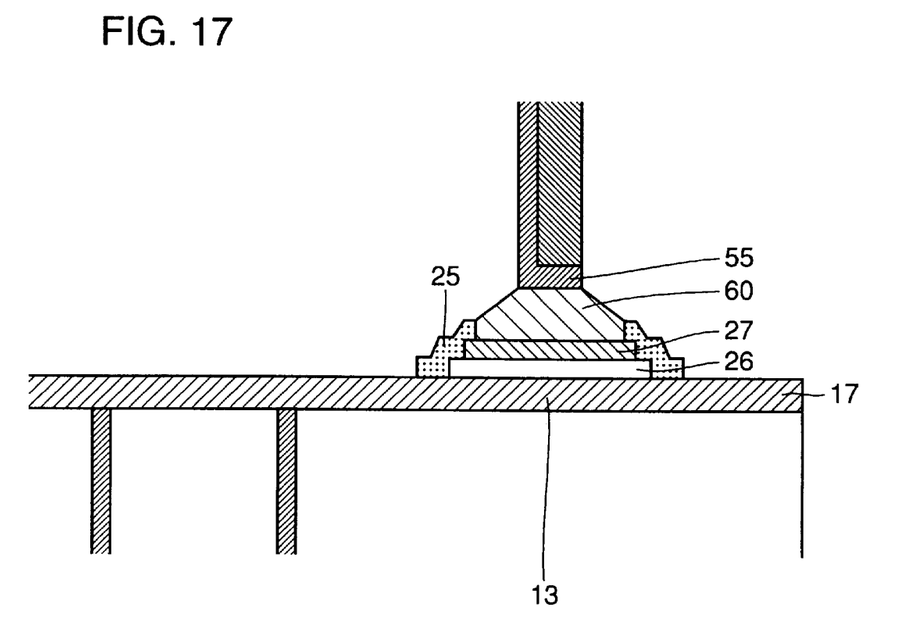
FIG. 17 is a cross sectional view illustrating a crossing portion of the signal line and an edge of the cap of the high-frequency semiconductor device according to the first embodiment of the invention.
Figure 18:
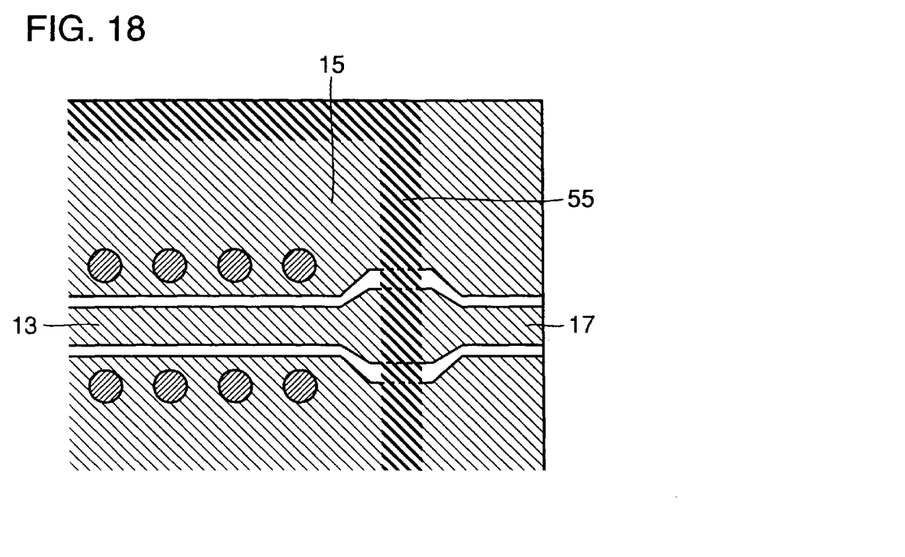
FIG. 18 is a plan view illustrating the crossing portion of the signal line and the edge of the cap of the high-frequency semiconductor device according to the first embodiment of the invention.

FIG. 17 is an enlarged cross sectional view illustrating where signal line 13 extending to an outer terminal 17 and cap edge 55 cross with each other, and FIG. 18 is a plan view thereof. On signal line 13, a crossing section ceramic layer 26 is placed to reach outer periphery ground 15 on both sides of signal line 13, and a crossing section conductor layer 27 is placed on the ceramic layer. This arrangement prevents short circuit of signal line 13 and a conductive jointing material 60. At this portion, the effective dielectric constant changes depending on crossing section ceramic layer 26 or the like, and accordingly the width of signal line 13 or the like is changed for matching.

In the high-frequency semiconductor device according to this embodiment, peripheral bumps are provided at the high-frequency semiconductor chip with an interval equal to or less than one fourth of the effective wavelength, and the conductive through holes connecting the front ground and the back ground are provided in a prescribed area at the input/output portion of the signal line of the substrate high-frequency circuit, so that the high-frequency circuit inside the high-frequency semiconductor chip can be sealed in terms of electromagnetic wave as described above. Consequently, high-frequency design of the high-frequency semiconductor device can be easily made with a reduced size. In addition, a group of conductive through holes are provided in the prescribed area along the high-frequency signal line, so that sealing in terms of electromagnetic wave for the high-frequency signal line can be enforced. Accordingly, design of the high-frequency package accommodating the high-frequency semiconductor chip can be made highly easily.

(Second Embodiment)

Figure 19:
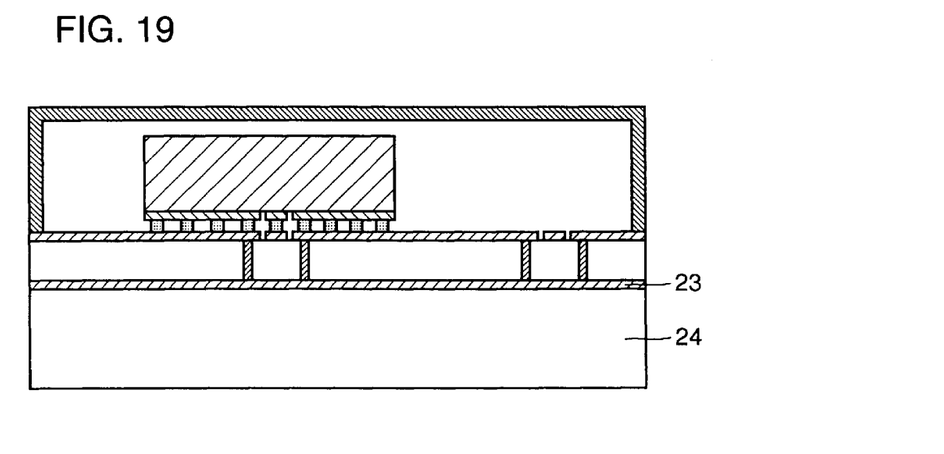
FIG. 19 illustrates a cross section of a high-frequency semiconductor device according to the second embodiment of the invention.

FIG. 19 illustrates a cross section of a high-frequency semiconductor device according to the second embodiment of the invention. This high-frequency semiconductor device is different from the high-frequency semiconductor device of the first embodiment shown in FIGS. 5 and 6 in that a substrate lower layer base 24 is placed below back ground 16. Therefore, the detailed description of the same structure and function is not repeated here. Substrate lower layer base 24 provides a mechanically enforced structure in addition to those effects obtained by the high-frequency semiconductor device of the first embodiment.

(Third Embodiment)

Figure 20:
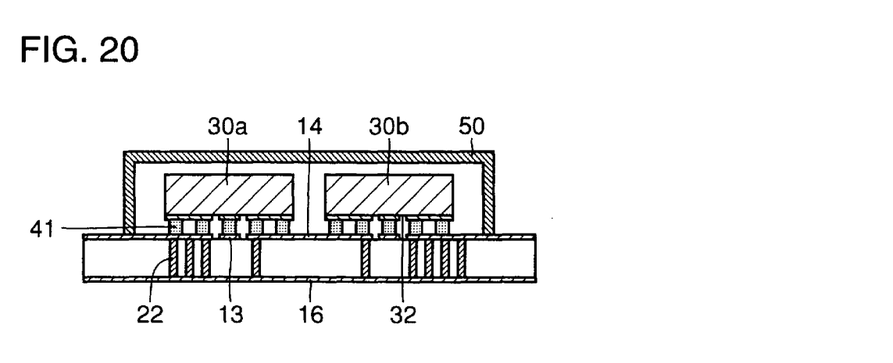
FIG. 20 illustrates a cross section of a high-frequency semiconductor device according to the third embodiment of the invention.

FIG. 20 illustrates a cross section of a high-frequency semiconductor device according to the third embodiment of the invention. The only difference between this high-frequency semiconductor device and that of the first embodiment shown in FIGS. 5 and 6 is that a plurality of high-frequency semiconductor chips 30*a* and 30*b* are mounted on a substrate high-frequency circuit 12. Therefore, the detailed description of the same structure and function is not repeated here. Peripheral bumps 41 are formed at high-frequency semiconductor chips 30*a* and 30*b* with an interval equal to or less than one fourth of the effective wavelength of the high-frequency signal as described in conjunction with the high-frequency semiconductor device of the first embodiment. In addition, a conductive through hole 22 connecting a front ground 14 and a back ground 16 is formed in an area separated from peripheral bump 41 by one fourth of the effective wavelength or less and separated from a signal line 13 by one fourth of the effective wavelength or less in the vicinity of the portion where a signal bump of high-frequency semiconductor chip 30 and signal line 13 are connected.

Emission of electromagnetic waves from a chip high-frequency circuit 32 is shut out by peripheral bumps 41 at high-frequency semiconductor chips 30*a* and 30*b* respectively, so that arrangement of such a complicated electromagnetic wave absorption block as described in conjunction with the conventional art or mounting of a high-frequency semiconductor chip on an interconnection substrate after placing the chip in a separate package is not required. Consequently, compared with the conventional high-frequency semiconductor device with a plurality of high-frequency semiconductor chips mounted as shown in FIG. 3 or FIGS. 4A–4B, the high-frequency semiconductor chip of this embodiment can exhibit a superior high-frequency characteristic with a small size and an advantageous cost.

Two of high-frequency semiconductor chips are arranged as shown in FIG. 20 in this embodiment. Even if the number of the high-frequency semiconductor chips increases, design is very easy since sealing in terms of electromagnetic wave is possible by providing peripheral bumps on the periphery of each high-frequency semiconductor chip.

Although the high-frequency semiconductor chip for the millimetric wave is used for description of the high-frequency semiconductor devices of the first to the third embodiments, the invention is apparently applicable to the high-frequency semiconductor device for any frequency lower or higher than the millimetric wave.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high-frequency semiconductor device comprising:
   an interconnection substrate having a first and second surfaces where a substrate high-frequency circuit including a first ground is formed on the first surface and the second surface has a second ground; and
   a high-frequency semiconductor chip with peripheral bumps including ground bumps on a periphery of the high-frequency chip with an interval between the bumps being equal to a first prescribed length or less, so as to surround the high-frequency semiconductor chip where a chip high-frequency circuit is formed, wherein
   conductive through holes are placed in a region separated by the first prescribed length or less from a signal line connected to a signal bump of said high-frequency semiconductor chip and separated by the first prescribed length or less from said peripheral bumps to connect said first ground and said second ground.

2. The high-frequency semiconductor device according to claim 1, wherein
   a perimeter region of a chip mount area of said substrate high-frequency circuit is a coplanar line.

3. The high-frequency semiconductor device according to claim 1, wherein
   said first prescribed length is one fourth of an effective wavelength of a high-frequency signal.

4. The high-frequency semiconductor device according to claim 1, wherein
   said peripheral bumps are formed by bumping using a wire.

5. The high-frequency semiconductor device according to claim 1, wherein
   said high-frequency semiconductor chip has one surface where the chip high-frequency circuit including a third ground is formed and the other surface where a fourth ground connected to said third ground by a through hole.

6. The high-frequency semiconductor device according to claim 1, wherein
   a group of conductive through holes are placed in a region of said interconnection substrate separated from said signal line by a second prescribed length or less with an interval equal to or less than said second prescribed length to connect said first ground and said second ground.

7. The high-frequency semiconductor device according to claim 6, wherein
   said second prescribed length is one fourth of an effective wavelength of a high-frequency signal.

8. The high-frequency semiconductor device according to claim 6, wherein
   a perimeter region of a chip mount area of said substrate high-frequency circuit is a coplanar line.

9. The high-frequency semiconductor device according to claim 6, wherein
   said first prescribed length is one fourth of an effective wavelength of high-frequency signal.

10. The high-frequency semiconductor device according to claim 6, wherein
    said peripheral bumps are formed by bumping using a wire.

11. The high-frequency semiconductor device according to claim 6, wherein
    said high-frequency semiconductor chip has one surface where the chip high-frequency circuit including a third ground is formed and the other surface where a fourth ground connected to said third ground by a through hole is formed.

12. The high-frequency semiconductor device according to claim 6, further comprising a cap hermetically sealing a surface where said substrate high-frequency circuit of said interconnection substrate is formed.

13. The high-frequency semiconductor device according to claim 6, wherein
    a plurality of high-frequency semiconductor chips are mounted at said substrate high-frequency circuit.

14. The high-frequency semiconductor device according to claim 1, further comprising a cap for hermetically sealing a surface where said substrate high-frequency circuit of said interconnection substrate is formed.

15. The high-frequency semiconductor device according to claim 1, wherein
    a plurality of high-frequency semiconductor chips are mounted at said substrate high-frequency circuit.

16. The high-frequency semiconductor device according to claim 1 wherein the ground bumps are not adjacent to each other.

17. The high-frequency semiconductor device according to claim 1 wherein the peripheral bumps also include signal bumps.

18. The high-frequency device according to claim 1 wherein the first prescribed length or less is about 1 millimeter to about several tens microns.

* * * * *